(12) United States Patent
Taylor

(10) Patent No.: US 7,071,677 B2
(45) Date of Patent: Jul. 4, 2006

(54) ACCURATE AND EFFICIENT SENSING METHOD FOR BI-DIRECTIONAL SIGNALS

(75) Inventor: John P. Taylor, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 11/301,963

(22) Filed: Dec. 12, 2005

(65) Prior Publication Data

US 2006/0097731 A1    May 11, 2006

Related U.S. Application Data

(62) Division of application No. 10/757,902, filed on Jan. 14, 2004, now Pat. No. 6,982,559.

(51) Int. Cl.
  *G01R 1/00*    (2006.01)
  *G01R 27/02*   (2006.01)
  *H04B 1/04*    (2006.01)

(52) U.S. Cl. .................. 324/111; 324/609; 455/127.1

(58) Field of Classification Search ............. 324/609, 324/602, 600, 111, 522, 713; 323/282, 353; 327/9, 337, 50–56, 91–96; 341/122–125, 341/172; 363/76, 78, 89; 455/127.1
See application file for complete search history.

(56) References Cited

U.S. PATENT DOCUMENTS

| | | | |
|---|---|---|---|
| 3,996,480 A * | 12/1976 | Hentschel | |
| 5,331,230 A * | 7/1994 | Ichihara | |
| 5,498,984 A * | 3/1996 | Schaffer | |
| 5,627,740 A * | 5/1997 | Johari | |
| 5,689,162 A * | 11/1997 | Li | |
| 5,769,873 A * | 6/1998 | Zadeh | |
| 5,831,562 A * | 11/1998 | Van auken et al. | |
| 6,172,481 B1 * | 1/2001 | Curtiss | |
| 6,184,665 B1 * | 2/2001 | Salina et al. | |
| 6,285,220 B1 * | 9/2001 | Gaillard et al. | |
| 6,426,657 B1 * | 7/2002 | Miyatake et al. | |
| 6,497,135 B1 * | 12/2002 | Sanders et al. | |
| 6,529,049 B1 * | 3/2003 | Erhart et al. | |
| 6,577,139 B1 * | 6/2003 | Cooper ........................ 324/600 |
| 6,577,302 B1 * | 6/2003 | Hunter et al. ................ 345/204 |
| 6,621,259 B1 * | 9/2003 | Jones et al. .............. 324/123 C |
| 6,867,595 B1 * | 3/2005 | Chen ........................... 324/433 |
| 6,937,174 B1 * | 8/2005 | Higashi et al. .............. 341/122 |

* cited by examiner

*Primary Examiner*—Anjan Deb
*Assistant Examiner*—Hoai-An D. Nguyen

(57) ABSTRACT

An exemplary method and circuit for sensing bi-directional current through a resistive element comprises a sampling unit, a charge transfer unit, and an amplifier. The sampling unit is switchably coupled to the resistive element and samples and stores a voltage corresponding to a current flowing through the resistive element. The charge transfer unit switchably connects the sampling unit to the amplifier such that the charge transfer unit and the amplifier convert the sampled voltage to a ground-referenced output voltage corresponding to the magnitude of the current and in accordance with the direction of the current through resistive element.

6 Claims, 2 Drawing Sheets

ACCURATE AND EFFICIENT SENSING METHOD FOR BI-DIRECTIONAL SIGNALS

RELATED APPLICATIONS

This is a divisional of U.S. application Ser. No. 10/757,902, filed Jan. 14, 2004 and issued as U.S. Pat. No. 6,982,559, which is hereby incorporated by reference.

FIELD OF THE INVENTION

The present invention relates to the field of semiconductor devices. More specifically, the invention relates to current sensing circuits.

BACKGROUND OF THE INVENTION

Sensing circuits have been in wide use for detecting the current drawn through an electrical path or circuit loop in a variety of applications. For example, often it is desirable to ascertain the charge capacity of a battery for an electronic device in order to determine and/or display how long the device can be operated by a user. A known technique for ascertaining the charge capacity of battery involves measuring the discharge current drawn from the battery during operation and correlating the magnitude of the discharge current to the charge capacity level of the battery, as is known in the art.

In general, sensing circuits determine the discharge current by measuring the voltage across a resistor (also referred to as a "sense resistor"), where the sense resistor is either connected in series with the ground path in "low-side" sensing or connected in series with the positive terminal of the battery in "high-side" sensing. In the present application, the voltage measured across the sense resistor is also referred to as the "sense voltage." Since the sense voltage is a function of the current, e.g., discharge current, through the sense resistor, the charge capacity level of the battery can be determined from the magnitude of the sense voltage.

As electronic devices incorporate batteries capable of being recharged, it has also become desirable to sense the charge current in addition to the discharge current in order to accurately monitor and charge the battery. Consequently, bi-directional current sensing circuits have been implemented for detecting discharge current and charge current, which flows in the opposite direction of the discharge current. Known bi-directional current sensing circuits, however, are associated with a number of disadvantages. For example, a common bi-directional current sensing approach employs current mirror circuitry. Due to a number of variations, such as variations in process and temperature, for example, the elements of the current mirror are very difficult to match. As a consequence, erroneous results can be generated by such bi-directional current sensing circuits.

Furthermore, the output generated by conventional bi-directional current sensing circuits employing current mirror circuitry has significantly reduced dynamic range since a reference voltage between ground and the supply voltage ("VCC") is used to differentiate between charge current and discharge current. In a typical arrangement, the reference voltage is set to approximately half of VCC such that output voltage of the sensing circuit which is less than the reference voltage corresponds to discharge current, while output voltage which is greater than the reference voltage corresponds to charge current. For example, where ground is zero (0) volts ("V") and VCC is 5V, output voltage between 0V and 2.5V corresponds to discharge current while output voltage between 2.5V and 5V corresponds to charge current. According to this example, the resolution of the output voltage is reduced by factor of two, significantly diminishing the dynamic range of the sensing circuit output.

Other known bi-directional current sensing circuits have employed complex circuit components, such as CMOS-based amplifiers, to improve dynamic range. However, such complex circuits result in significantly increased components and silicon area consumption, thereby increasing expense and reducing yield, which are undesirable.

SUMMARY OF THE INVENTION

An accurate and efficient sensing circuit and method for bi-directional signals is disclosed. By way of illustration, an exemplary sampling unit is switchably coupled to a resistive element, such a sense resistor or field effect transistor, for example. The sampling unit samples and stores a voltage across the resistive element corresponding to a current flowing through the resistive element. Current may flow through the resistive element in either direction. Thus, the sampling unit is further switchably coupled to an amplifier by a charge transfer unit. In this way, the charge transfer unit and the amplifier convert the sampled voltage to a ground-referenced output voltage corresponding to the magnitude of the current and in accordance with the direction of the current through resistive element.

According to various embodiments, one or more of benefits may be realized by the sensing circuit including, for example, improved dynamic range, improved current sensing accuracy, reduced device complexity, reduced manufacturing costs, improved battery capacity gauging and accurate battery charge monitoring for battery-operated devices, among others.

Other features and advantages of the present invention will become more readily apparent to those of ordinary skill in the art after reviewing the following detailed description and accompanying drawings.

DETAILED DESCRIPTION OF THE INVENTION

Figure 1:
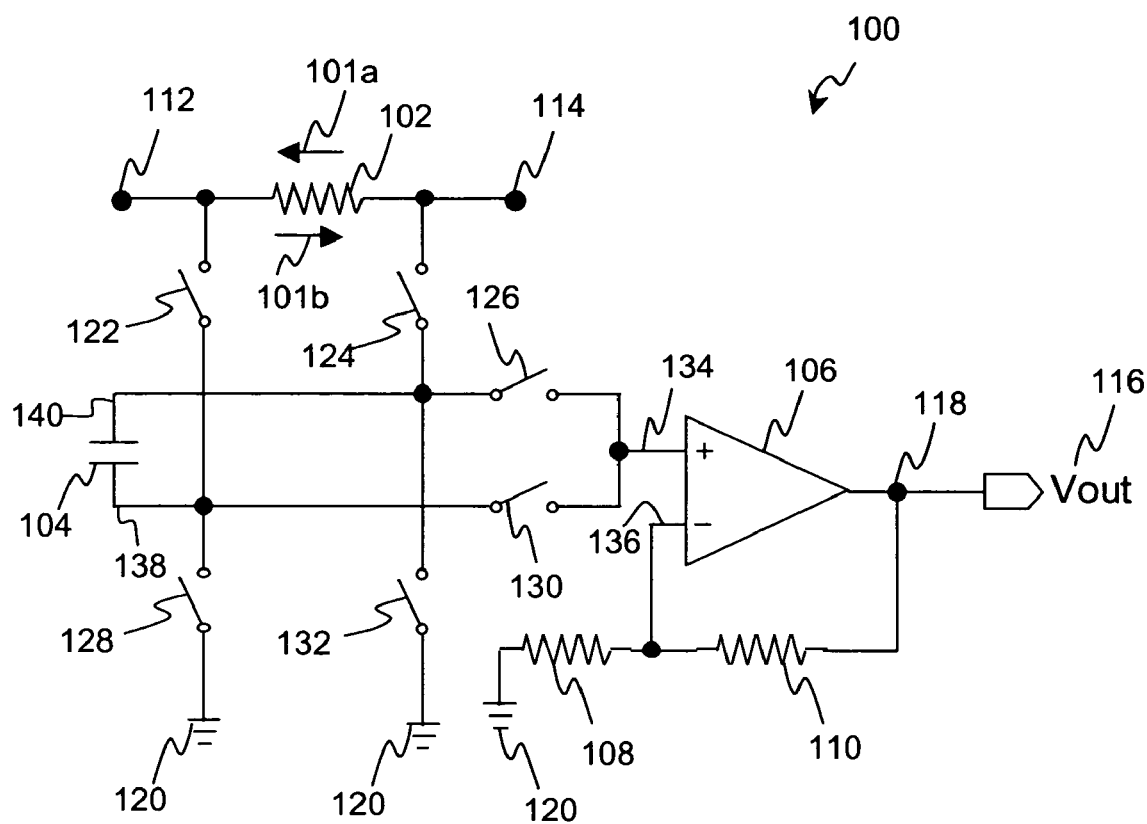
FIG. 1 illustrates a circuit diagram of an exemplary current sensing circuit in accordance with one embodiment of the present invention.

Referring first to FIG. 1, there is shown exemplary current sensing circuit 100 in accordance with one embodiment of the present invention. As discussed below, sensing circuit 100 is capable of accurately sensing bi-directional signals that flow through resistor 102 including current 101a from node 114 to node 112 and current 101b from node 112 to node 114 in an accurate and efficient manner.

By way of illustration, sensing circuit 100 is suitable for use in detecting charge current and discharge current in a portable device, such as a mobile communication device or a wireless handset device. A typical mobile communication device includes, among other things, a transceiver for transmitting and receiving an RF signal, and a mobile power source, such as a battery or fuel cell, coupled to the transceiver for supplying power to the transceiver. As such, sensing circuit 100 may be integrated into a mobile communication device to provide accurate battery capacity gauging and accurate battery charge monitoring.

In FIG. 1, resistor 102 represents any resistive element through which currents 101a and/or 101b are to be detected. For example, resistor 102 can be a field effect transistor ("FET") connected in series with the battery in a high-side sensing arrangement or connected in series with the ground path in a low-side sensing arrangement. In a high-side sensing arrangement, for example, the positive terminal of a battery (not shown) may be connected to node 112, and node 114 may be connected either to a charging unit (not shown) or to the device system (not shown). In such an arrangement, current 101a represents the charge current and current 101b represents the discharge current. In the present application, resistor 102 is also referred to as the "sense resistor;" each of currents 101a and 101b is also referred to as the "sense current;" and the voltage across resistor 102 is also referred to as the "sense voltage."

Continuing with FIG. 1, sensing circuit 100 comprises capacitor 104, operational amplifier 106, resistors 108 and 110, and switches 122, 124, 126, 128, 130 and 132. Capacitor 104 functions as a sampling unit to detect, sample and store the sense voltage across resistor 102 during a sampling mode, and is capable of being switchably coupled to resistor 102. More particularly, first terminal 140 of capacitor 104 is coupled to a first end of resistor 102 at node 114 by switch 124, and second terminal 138 of capacitor 104 is coupled to a second end of resistor 102 at node 112 by switch 122 during a sampling mode. The charge sampled and stored by capacitor 104 corresponds to the sense voltage across resistor 102, which, in turn, corresponds to the sense current, i.e., either current 101a or current 101b, through resistor 102. Capacitor 104 may, for example, be approximately 1–100 nanoFarads in certain embodiments. According to another embodiment of the present invention, capacitor 104 may be maintained across nodes 112 and 114 when not sampling to reduce or eliminate the charge time for capacitor 104 prior to switching.

Capacitor 104 is further capable of being switchably connected to operational amplifier 106 during a charge transfer mode to transfer the charge from capacitor 104 to operational amplifier 106 and for generating output voltage ("Vout") 116. As a benefit of this arrangement, support for bi-directional current sensing (i.e., both currents 101a and 101b) with significantly improved dynamic range output is achieved in an efficient and cost-effective manner, as discussed below. As shown in FIG. 1, switches 126, 128, 130 and 132 operate as a charge transfer unit for this purpose. More particularly, first terminal 140 of capacitor 104 is coupled to non-inverting input 134 of operational amplifier 106 by way of switch 126 and second terminal 138 of capacitor 104 is connected to ground 120 by way of switch 128 during a charge transfer mode to transfer the sense voltage corresponding to sense current 101a from capacitor 104 to operational amplifier 106. Alternatively, second terminal 138 of capacitor 104 is coupled to non-inverting input 134 of operational amplifier 106 by way of switch 130 and first terminal 140 of capacitor 104 is connected to ground 120 by way of switch 132 during a charge transfer mode to transfer the sense voltage corresponding to sense current 101b from capacitor 104 to operational amplifier 106.

Operational amplifier 106 is configured to amplify the sense voltage and generate output voltage ("Vout") 116 at output node 118. Even though the sense voltage across resistor 102 may be a common-mode signal, Vout 116 generated by sensing circuit 100 is referenced to ground 120 due to the operation of switches 128 and 132 during the charge transfer operation. Vout 116 may then be transmitted to other components, e.g., an analog-to-digital converter (ADC), for further processing. The gain ("G") of operational amplifier is given by:

$$G=1+(R_F/R_1)$$ (Equation 1)

where $R_F$ and $R_1$ correspond to the resistances of resistor 110 and resistor 108, respectively, in FIG. 1. As shown in FIG. 1, resistor 110 is connected between output node 118 and inverting input 136 of operational amplifier 106 to provide negative feedback, and resistor 108 is connected between inverting input 136 of operational amplifier 106 and ground 120. According to one particular embodiment, the ratio of resistor 110 to resistor 108 is fifteen (15) resulting in a gain of 16 for operational amplifier 106.

Unlike conventional sensing circuits requiring expensive and complex operational amplifiers, operational amplifier 106 may be employed with a relatively simple operational amplifier, e.g., based on bipolar junction transistors, which results in significantly reduced device complexity and reduced silicon area consumption. As a benefit, manufacturing costs are reduced and device yield is increased.

Moreover, due to the arrangement and operation of switches 122, 124, 126, 128, 130 and 132 in conjunction with capacitor 104 and operational amplifier 106, sensing circuit 100 provides support for bi-directional current sensing (i.e., both currents 101a and 101b) with an output voltage having significantly improved dynamic range, resulting in significantly improved current sensing accuracy. For example, sensing circuit 100 does not require a reference voltage for differentiating between currents 101a and 101b at Vout 116. Instead, the full range of Vout 116, e.g., between ground and the supply voltage, can be associated with the sense voltage corresponding to either current 101a and 101b, depending on which of switches 126, 128, 130 and 132 were activated during the charge transfer operation between capacitor 104 and operational amplifier 106, as discussed above. As a benefit, the dynamic range of Vout 116 is greatly improved, which results in improved accuracy for determining the current through resistor 102.

Figure 2:
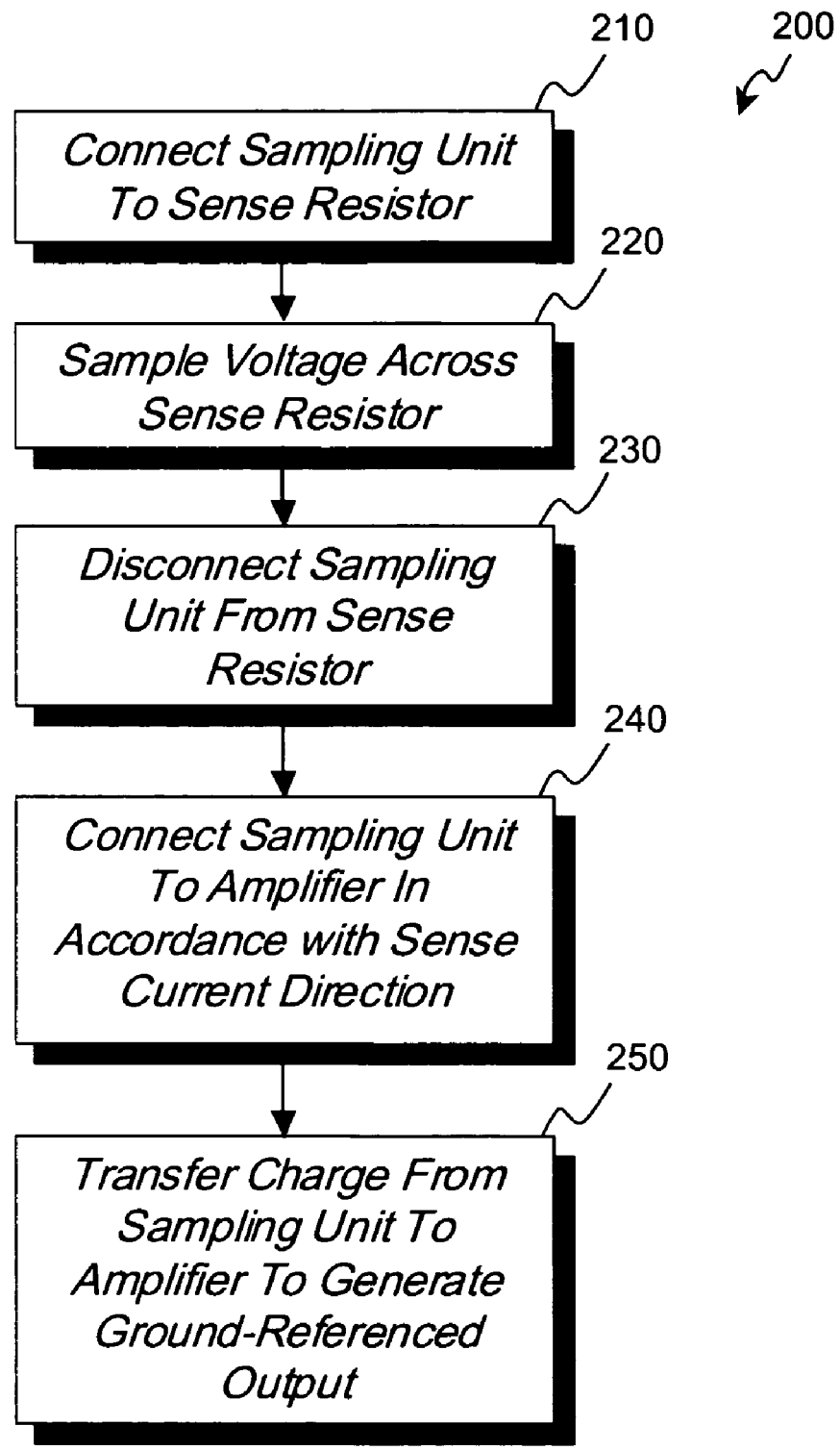
FIG. 2 illustrates a flow chart showing an exemplary current sensing operation in accordance with one embodiment of the present invention.

Referring now to flow chart 200 of FIG. 2, there is shown an exemplary operation for sensing circuit 100 according to one embodiment of the present invention. Certain details and features have been left out of flow chart 200 of FIG. 2 that are apparent to a person of ordinary skill in the art. For example, a step may consist of one or more sub-steps or may involve additional circuitry, as known in the art. While steps 210 through 250 shown in flow chart 200 are sufficient to describe one embodiment of the present invention, other embodiments of the invention may utilize steps different from those shown in flow chart 200.

At step 210, capacitor 104 is connected to resistor 102 during a sampling mode by activating (or "closing") switches 122 and 124 and deactivating (or "opening") switches 126, 128, 130 and 132. As discussed above, resistor 102 develops a sense voltage across nodes 112 and 114 proportional to the sense current through resistor 102. This sense voltage corresponds to the magnitude of current 101a when a battery connected to node 112 is being charged by a charging unit connected to node 114 or to the magnitude of current 101b when a battery connected to node 112 supplies a voltage to a device system connected to node 114, i.e., during battery discharge. First terminal 140 of capacitor 104 develops a higher potential relative to second terminal 138 during battery charging. Conversely, second terminal 138 of capacitor 104 develops a higher potential relative to first terminal 140 during battery discharge.

At step 220, the sense voltage across resistor 102 is sampled and stored by capacitor 104. At step 230, the sampling mode is concluded, and switches 122 and 124 are deactivated to disconnect capacitor 104 from resistor 102.

At step 240, capacitor 104 is connected to non-inverting input 134 of operational amplifier 106 in accordance with the direction of the sense current through resistor 102. For example, switches 126 and 128 are activated to connect first terminal 140 of capacitor 104 to non-inverting input 134 of operational amplifier 106 and to connect second terminal 138 of capacitor 104 to ground 120 for detecting battery charge current, i.e., current 101a. In this case, switches 130 and 132 remain open. As another example, switches 130 and 132 are activated to connect second terminal 138 of capacitor 104 to non-inverting input 134 of operational amplifier 106 and to connect first terminal 140 of capacitor 104 to ground 120 for detecting battery discharge current, i.e., current 101b. In this case, switches 126 and 128 remain open.

At step 250, the charge stored by capacitor 104 (corresponding to the sense voltage detected during step 220) is transferred to operational amplifier 106 and amplified by operational amplifier 106 to generate Vout 116 at output node 118. As discussed above Vout 116 is ground-referenced and has significantly improved dynamic range, which provides improved accuracy in detecting the sense current across resistor 102. Moreover, due to the switching operation discussed above, support for detecting the sense current across resistor 102 in both directions, i.e., currents 101a and 101b, is provided. Furthermore, these advantages are realized by sensing circuit 100 with significantly reduced device complexity, resulting in reduced manufacturing costs and increased device yield. In addition, sensing circuit 100 exhibits greater tolerance to process and temperature variations since current mirror circuitry is not required.

Furthermore, control of switches 126, 128, 130 and 132 can be easily provided without significantly increased circuitry. For example, signals representative of the presence or absence of a battery charging condition can typically be used to enable switches 126 and 128 and disable switches 130 and 132 or to disable switches 126 and 128 and enable switches 130 and 132, respectively. Alternatively, the polarity of the sense voltage can be determined by taking two samples from capacitor 104, i.e., the first sample taken while enabling switches 126 and 128 and disabling switches 130 and 132, and the second sample taken while disabling switches 126 and 128 and enabling switches 130 and 132, wherein the more positive of the two samples identifies the amplitude and polarity of the sense voltage.

In sum, due to the particular arrangement and operation of sensing circuit 100, significantly improved accuracy in detecting sense current through resistor 102 is achieved in an efficient and cost effective manner, as discussed above. The benefits of sensing circuit 100 can thus be realized in a number of applications. For example, an accurate measure of the capacity of a battery can be determined and indicated to the user of a device. Furthermore, efficient and improved battery charging can be carried out since an accurate measure of the charge current can be ascertained.

From the above description of exemplary embodiments of the invention, it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, a resistor (not shown) could be placed in series with capacitor 104 and non-inverting input 134 of operational amplifier 106 in FIG. 1 to provide a time-averaged representation of a fast moving signal in certain embodiments. In this particular case, a second capacitor (not shown) may be further connected across non-inverting input 134 of operational amplifier 106 and ground 120 to prevent slewing of Vout 116 between samples. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, an accurate and efficient sensing circuit and method for bi-directional signals have been described.

What is claimed is:

1. A method for sensing bi-directional current through a resistive element, the method comprising:
   sampling a voltage across the resistive element during a sampling mode;
   storing the sampled voltage to a sampling unit during the sampling mode;
   connecting a first terminal of the sampling unit to a first input of an amplifier when the current flows through the resistive element in a first direction; and
   connecting a second terminal of the sampling unit to the first input of the amplifier when the current flows through the resistive element in a second direction opposite the first direction.

2. The method of claim 1 further comprising generating a ground-referenced voltage at an output of the amplifier corresponding to the current through the resistive element.

3. The method of claim 1 further comprising:
   connecting the second terminal to ground when the current flows through the resistive element in the first direction; and
   connecting the first terminal to ground when the current flows through the resistive element in the second direction.

4. The method of claim 1 further comprising disconnecting the sampling unit from the resistive element after the sampling mode.

5. The method of claim 1 wherein the amplifier comprises a bipolar junction transistor-based operational amplifier.

6. The method of claim 1 wherein the sampling unit comprises a capacitor.

* * * * *